United States Patent [19]

Lyle

[11] Patent Number: 4,876,463
[45] Date of Patent: Oct. 24, 1989

[54] DUTY CYCLE CONTROLLER FOR HORIZONTAL SYNCHRONIZATION SIGNALS IN A TELEVISION RECEIVER

[75] Inventor: Robert L. Lyle, Knoxville, Tenn.

[73] Assignee: North American Philips Corporation, New York, N.Y.

[21] Appl. No.: 183,964

[22] Filed: Apr. 20, 1988

[51] Int. Cl.$^4$ .................. H03K 5/04; H03K 17/56; H03K 4/08; H04N 5/08
[52] U.S. Cl. .................... 307/265; 307/246; 307/228; 307/234; 328/58; 358/153; 358/158; 358/148
[58] Field of Search .............. 307/265, 246, 228, 234; 328/58; 358/153, 158, 148

[56] References Cited

U.S. PATENT DOCUMENTS

| | | | |
|---|---|---|---|
| 3,714,470 | 1/1973 | Goldberg | 307/265 |
| 4,277,697 | 7/1981 | Hall et al. | 307/265 |
| 4,330,751 | 5/1982 | Swain | 328/58 |
| 4,621,240 | 11/1986 | Alvord et al. | 358/148 |
| 4,672,448 | 6/1987 | Gioiosa | 358/158 |
| 4,682,226 | 7/1987 | Kadlec | 358/148 |

Primary Examiner—Stanley D. Miller
Assistant Examiner—Trong Quang Phan
Attorney, Agent, or Firm—Algy Tamoshunas; Marianne R. Rich

[57] ABSTRACT

A pulse generator of controllable duty cycle for horizontal synchronization signals in a television receiver is provided. The pulse generator broadly comprises a duty cycle control loop with a comparator means having an output coupled to the output of the pulse generator, a duty cycle detector means coupled to the comparator means for detecting the duty cycle of the output of the comparator means, a duty cycle control means for setting the duty cycle of the output of the comparator means to a desired value, and an error feedback means coupled to the duty cycle control means, the duty cycle detector means, and the comparator means. Duty cycle control is achieved either by a control pulse or by means of a voltage divider which is coupled between a supply voltage and ground, with a voltage divider node connected to the base of the error feedback transistor. The comparator means, the duty cycle of which is the duty cycle of the pulse generator, is turned on by means of the voltage at its base dropping 0.7 V below the voltage at its emitter. The rate of change of the base voltage is in turn controlled by an RC time constant and the error feedback means. The comparator means is turned off by means of an edge trigger means which receives the horizontal synchronization signal as an input.

36 Claims, 4 Drawing Sheets

DUTY CYCLE CONTROLLER FOR HORIZONTAL SYNCHRONIZATION SIGNALS IN A TELEVISION RECEIVER

BACKGROUND

The present invention relates generally to a duty cycle controller for a pulse generator. More particularly, the present invention relates to a pulse generator with a duty cycle controller which permits a desired duty cycle to be obtained for horizontal synchronization signals in a television receiver independent of supply voltage, temperature, and frequency.

Pulse generators are known in the art. Typically, the pulse generators have open loop arrangements which cause their duty cycle to be dependent on frequency, supply voltage, temperature, and other disturbances. In order to free the pulse generator from frequency dependency, it has been suggested in the art that a frequency divider be utilized. However, while pulse generators which are independent of frequency have been so arranged, such pulse generators are capable of providing a fifty percent duty cycle only. Clearly then, a pulse generator of controllable duty cycle which is independent of frequency, voltage supply, temperature, and other disturbances is highly desirable.

SUMMARY OF THE INVENTION

It is therefore an object of the invention to provide a pulse generator of controllable duty cycle.

It is a further object of the invention to provide a pulse generator of controllable duty cycle which is substantially independent of input frequency, and power supply voltage.

It is another object of the invention to provide a duty cycle controller which is substantially independent of input frequency, power supply voltage, temperature, and other disturbances.

It is yet another object of the invention to provide a pulse generator of controllable duty cycle which is substantially independent of input frequency and power supply voltage, and which utilizes an edge trigger means for starting a cycle and a duty cycle control loop for permitting a desired duty cycle to be obtained.

In accord with the objects of the invention, a pulse generator of controllable duty cycle having a pulse input and providing a pulsed output of controllable duty cycle is provided and broadly comprises:

(a) a duty cycle control loop comprising, a comparator means having an output coupled to said controllable duty cycle pulsed output, a duty cycle detector means coupled to said comparator means for detecting the duty cycle of the output of said comparator means, a duty cycle control means for setting said duty cycle of said output of said comparator means to a desired value, and an error feedback means coupled to said duty cycle control means, said duty cycle detector means, and said comparator means; and (b) an edge trigger means for triggering a change in state of said comparator means in response to an edge of said input pulse.

Preferably, the error feedback means comprises a ("second") transistor of a first type (such as an npn transistor), with its collector connected to the base of the comparator means which is preferably a ("first") transistor of a second type (such as a pnp transistor). Also, preferably, the duty cycle control means is comprised of a voltage divider (e.g. at least two resistors arranged in series) which is coupled between a supply voltage and ground, with a voltage divider node connected to the base of the second (error feedback amplifier) transistor. Further, the duty cycle detector means preferably comprises a resistor and capacitor connected in series between ground and the collector of the first (comparator) transistor, with the resistor coupled between the collector of the first transistor and the emitter of the second transistor, and the capacitor coupled between the emitter of the second transistor and ground.

Additional circuitry is provided to make the duty cycle of the pulse generator substantially independent of temperature and supply voltage effects.

With the provided arrangement, the voltage at the emitter of the second transistor (i.e. at the capacitor) is a function of the duty cycle of the first transistor, as when the first transistor is on, current flows through the first transistor and charges the capacitor, while when the first transistor is off, the capacitor discharges through the resistor coupled thereto and through a pull-down resistor coupled from the collector of the first transistor and ground. Since the voltage at the base of the second transistor is predetermined according to the voltage divider, the base-emitter drop across the second transistor will vary according the emitter voltage (which varies according to the duty cycle of the first transistor). Because the collector of the second transistor is connected to a second capacitor and the base of the first transistor, the second transistor act in a feedback capacity. When the first transistor is off, the second capacitor discharges through the second transistor causing the voltage at the base of the first transistor to drop and turn on the first transistor. The rate at which the second capacitor discharges is controlled by the base-emitter voltage of the second transistor. So, during a particular cycle, if the first transistor is off too long (duty cycle is too small), the emitter voltage of the second transistor drops too low. Hence, during the next cycle, a larger current is drawn from the second capacitor and the voltage drops more quickly at the base of the first transistor, thereby turning the first transistor on earlier (increasing the duty cycle). Conversely, if during a particular cycle the first transistor is on too long, more charge accumulates on the first capacitor, and the base-emitter voltage of the second transistor is reduced. Thus, in a succeeding cycle, the current flow from the second capacitor is reduced, the voltage at the base of the first transistor decreases less rapidly, and the first transistor is kept off for a longer period of time.

The first transistor is turned off by an edge trigger means which in the preferred embodiment is a negative edge trigger means and comprises a pull-down transistor having its base coupled to the input of the pulse generator and its collector coupled to the base of the first transistor of the duty cycle control loop.

The pulse generator of controllable duty cycle further preferably comprises an output buffer means for buffering the output of the first transistor from the load on the pulse generator.

A better understanding of the pulse generator of controllable duty cycle, and additional advantages and objects of the invention will become apparent to those skilled in the art upon reference to the detailed description and the accompanying drawings.

DETAILED DESCRIPTION OF THE PREFERRED EMBODIMENTS

Figure 1:
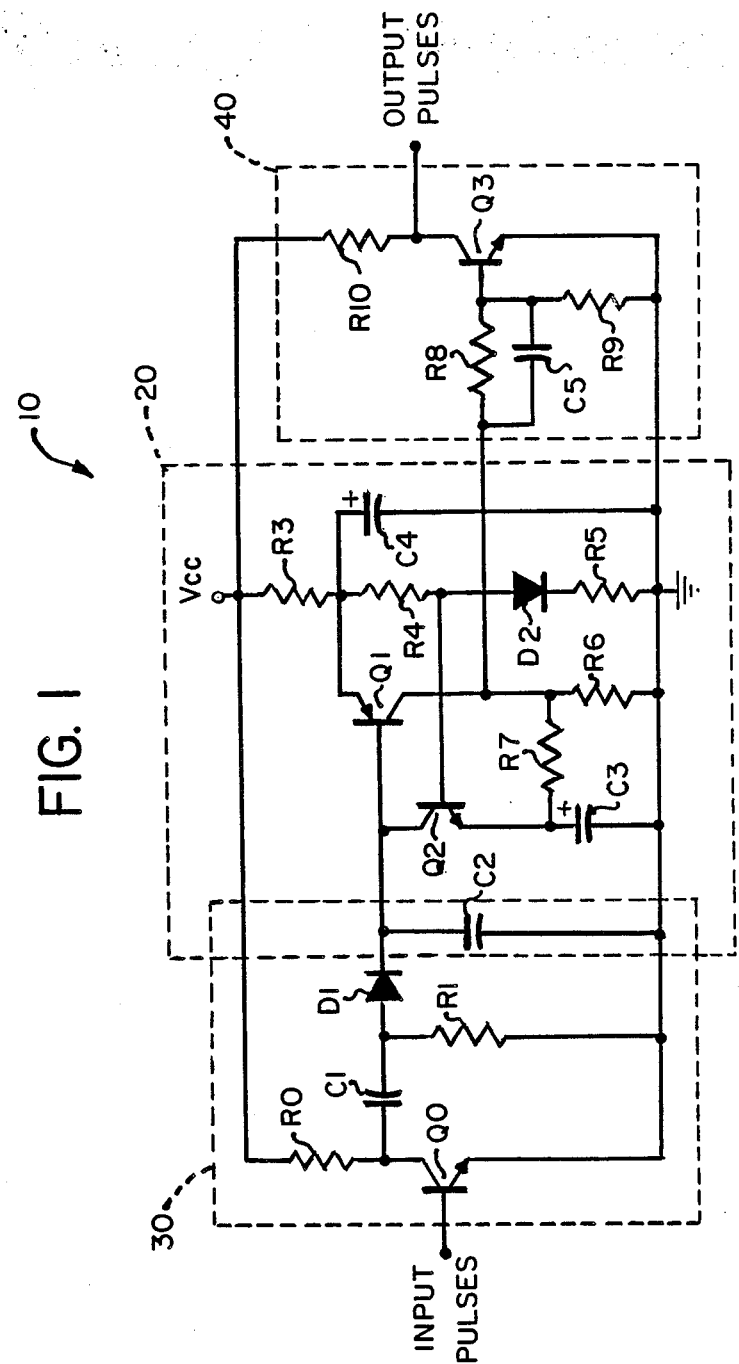
FIG. 1 is a circuit diagram of a first embodiment of the pulse generator of controllable duty cycle.

Turning to FIG. 1, a circuit diagram of a first embodiment of the pulse generator of controllable duty cycle 10 of the invention is seen. The provided circuit broadly comprises three sections: a duty cycle control loop 20 for providing a controlled duty cycle output pulse; an edge trigger means 30 for changing the state of a differential amplifier means of the duty cycle control loop 20; and an output buffer means 40 for buffering the output of the duty cycle control loop 20 from the load on the pulse generator 10. The purpose of the provided circuit is to permit an output pulse having a desired duty cycle to be generated essentially free of the duty cycle or frequency of the input pulse, the supply voltage, and the temperature.

In the preferred embodiment, npn-type transistor Q0, capacitors C1 and C2, resistors R0 and R1, and diode D1 form a negative edge trigger means 30 which, as will be described hereinfter, acts to turn transistor Q1 of the duty cycle control loop 20 off. When the voltage at the input to the pulse generator 10 (i.e. the base of transistor Q0) is high, transistor Q0 conducts current flowing through resistor R0 from the voltage supply $V_{cc}$, and the collector voltage of Q0 is pulled low. With the collector voltage of Q0 low, diode D1 is reversed biased. Hence, current will not flow off of capacitor C2 through R1 to ground. Likewise, with diode D1 reversed biased, pnp-type transistor Q1 will turn on or off based on the voltage difference at its emitter and its base, with its base voltage being determined by the voltage across capacitor C2.

When the voltage at the input to the pulse generator 10 goes low, transistor Q0 turns off, and the voltage at the collector of Q0 rises according to the time constant dictated by R0 and C2 (as C1 is very large and acts as a short circuit). With the voltage at the collector of Q0 rising, the voltage at the base of Q1 rises, and once the base voltage exceeds a voltage of approximately 0.7 V below the voltage at the emitter of Q1, transistor Q1 turns off. Simultaneously, capacitor C2 charges up, thereby permitting capacitor C2 to keep the voltage at the base of transistor Q1 high even after diode D1 is reverse biased or after the input pulse goes high and the voltage at the Q0 collector goes low. Hence, it will be appreciated that transistor Q0, capacitors C1 and C2, resistors R0 and R1, and diode D1 act in concert as an effective negative edge trigger means for transistor Q1. When the input pulse goes high, there is no effect on transistor Q1, while when the input pulse goes low, transistor Q1 is quickly turned off due to the rising voltage at its base.

The core of the pulse generator circuit is the duty cycle control loop 20 which is comprised of pnp-type transistor Q1, npn-type transistor Q2, capacitors C2, C3, and C4 (capacitor C2 being common to the duty control loop 20 and the edge trigger means 30), resistors R3, R4, R5, R6, and R7, and diode D2. The duty cycle control loop 20 preferably has several functioning elements. A first element is transistor Q1, the duty cycle (time on divided by cycle time) of which is controlled and essentially comprises the output of the pulse generator 10. As will be shown, the duty cycle of transistor Q1 is basically controlled by resistors R4 and R5 which act as a duty cycle control means. Resistor R7 and capacitor C3 act as a duty cycle detector means for detecting the duty cycle of transistor Q1. When transistor Q1 is on, capacitor C3 charges up (via C4, Q1, R7, and via $V_{cc}$, R3, Q1 and R7), while when Q1 is off, capacitor C3 discharges according to a R6-R7-C3 time constant. Hence, the voltage across capacitor C3 is a gauge of the duty cycle of transistor Q1. By using transistor Q2 as an error amplifier (amplifying the difference between the voltage at its base and the voltage at its emitter) that duty cycle information is in essence fed back to stabilize the duty cycle of transistor Q1. Diode D2 acts as a temperature compensation means to counteract the effect of temperature on the voltage drop across the base-emitter junction of transistor Q2. Capacitor C4 is very large and effectively acts as a battery for keeping the voltage at the emitter of transistor Q1 relatively constant regardless of changing current in transistor Q1. Resistor R3 acts to buffer capacitor C4 from the supply voltage and to drop the voltage on the emitter of transistor Q1 below $V_{cc}$.

In looking at the functioning of the duty cycle control loop in detail, a listing of the preferred values for the resistors and capacitors of the circuit is useful. Thus, for a duty cycle of forty-six percent, the following values are supplied:

| C1 | 1000 pF | R1 | 1 Kohm |
|---|---|---|---|
| C2 | 100 pF | R2 | 10 Kohm |
| C3 | 1 mF | R3 | 1 Kohm |
| C4 | 1 mF | R4 | 470 ohm |
| C5 | 100 pF | R5 | 1.2 Kohm |
|  |  | R6 | 10 Kohm |
| D1 | gen. purpose sig. diode | R7 | 10 Kohm |
| D2 | gen. purpose sig. diode | R8 | 10 Kohm |
| Q1 | gen. purp. pnp transistor | R9 | 3.3 Kohm |
| Q2 | gen. purp. npn transistor | R10 | 2.4 Kohm |
| Q3 | gen. purp. npn transistor |  |  |

It will be appreciated that the duty cycle of transistor Q1 is determined by the relative voltages at its emitter and at its base (hence, in broad terms, transistor Q1 is a "comparator"). The voltage at the emitter is kept relatively constant by capacitor C4 which due to its large capacitance acts as a battery. Long-term changes in the supply voltage will change the emitter voltage as resistors R3, R4, and R5 act as a voltage divider chain. However, as will be described hereinafter, the voltage at the base of transistor Q1 will likewise be affected, and hence the duty cycle of transistor Q1 is kept substantially supply voltage independent.

The voltage at the base of transistor Q1 is determined by a number of factors. When the input signal is high, transistor Q0 conducts and the voltage at the collector of transistor Q0 goes low, thereby reverse biasing diode D1. With diode D1 reverse biased, the voltage at the base of transistor Q1 is dictated by the voltage on capacitor C2. The voltage on capacitor C2 is in turn a function of its own charging and discharging. When the input signal is high, capacitor C2 discharges through transistor Q2 and resistors R7 and R6. The rate of discharge is determined by the base-emitter voltage of transistor Q2. As capacitor C2 discharges, the voltage at the base of transistor Q1 drops and transistor Q1 turns on. Transistor Q1 typically stays on until forced off by the negative edge trigger means responding to the input signal going low. With the input signal low, the voltage at the base of transistor Q1 rises according to the R0C2 time constant as capacitor C2 is charged via the supply line ($V_{cc}$), R0, C1 (which acts as a short circuit due to its large capacitance) and diode D1. When the voltage across capacitor C2 exceeds the emitter voltage of transistor Q1 minus approximately 0.7 V, transistor Q1 shuts off. It should be noted that immediately after the collector of Q0 goes high, the voltage on resistor R1 drops according to the C1R1 time constant which reverse biases diode D1 even if the collector of transistor Q0 stays high.

Because the duty cycle of transistor Q1 is dependent on the changes of voltage at its base (in the typical situation where the emitter voltage does not change), transistor Q2 can be seen to act as a feedback (error) amplifier regarding the duty cycle. This is so due to the fact that the rate at which capacitor C2 discharges is a function of the base-emitter voltage of transistor Q2. Since, typically, the base voltage of transistor Q2 is fixed by the voltage divider arrangement of resistors R3, R4, and R5, (and more particularly the values of resistors R4 and R5, as the voltage at the node between R3 and R4 is dictated by the voltage on capacitor C4 and the values of resistors R4 and R5), it is the emitter voltage of transistor Q2 which will dictate how quickly current will be drained off of capacitor C2. The emitter voltage, however, is primarily a function of the duty cycle of transistor Q1. This fact may be shown both by equation and reasoning. In particular, the voltage at emitter of transistor Q2 is equal to the voltage at the collector of transistor Q1 minus any voltage drop across resistor R7 ($V_{Q2emit} = V_{Q1col} - IR_7$). The voltage at the collector of transistor Q1 is equal to the peak voltage at the collector times the duty cycle plus the minimum voltage at the collector times one minus the duty cycle: $V_{Q1col} = V_{Q1col,peak}$ (duty cycle) $+ V_{Q1col,min}$ (1−duty cycle). Since the peak voltage at the collector of transistor Q1 is essentially equal to the voltage at the emitter of transistor Q1, and the voltage at the emitter of transistor Q1 is equal to the capacitor C4 voltage, the voltage at the emitter of transistor Q2 is seen to be approximately equal to the capacitor C4 voltage times the duty cycle of transistor Q1 with some offset.

The voltage at the emitter of transistor Q2 may also be understood to be a function of the duty cycle of transistor Q1 in another manner. When transistor Q1 is on, current from capacitor C4 and from the voltage supply line via resistor R3 act to charge capacitor C3, as the voltage at the collector of transistor Q1 is brought high. The longer transistor Q1 is on, the higher the voltage at capacitor C3 becomes, as capacitor C3 has a large capacitance and can store much charge. Thus, the longer transistor Q1 is on, the higher the voltage becomes at the emitter of transistor Q2. On the other hand, when transistor Q1 is off, the collector of transistor Q1 is free to float, and capacitor C3 may therefore discharge through resistors R7 and R6 to ground. Hence, the longer transistor Q1 is off (again within limits), the lower the voltage across the capacitor C3 becomes, and hence the lower the voltage becomes at the emitter of transistor Q2.

In light of the above, it will be appreciated that capacitor C3 and resistor R7 act together as a duty cycle detector, as the voltage across capacitor C3 mirrors the length of time transistor Q1 is on (and off). because a change in the emitter voltage of transistor Q2 changes the rate at which charge on capacitor C2 can be discharged through transistor Q2, transistor Q2 acts as a feedback error amplifier Thus, if transistor Q1 has been on too long during one cycle, the voltage at the emitter of transistor Q2 will rise. Hence, during a next cycle, the current flow through Q2 will decrease, the voltage at the base of transistor Q1 will drop more slowly, and transistor Q1 will remain turned off longer. Likewise, if transistor Q2 has been off too long during one cycle, the voltage at the emitter of transistor Q2 will drop below its typical value. With a larger base-emitter voltage across transistor Q2, during the next cycle more charge will be allowed to flow off of capacitor C2 through transistor Q2 resulting in a faster drop of the voltage at the base of transistor Q1 and an earlier turning on of transistor Q1.

Because the base-emitter voltage difference across transistor Q2 determines the rate of discharge of capacitor C2 and hence the rate at which the voltage at the base of transistor Q2 drops, it will be appreciated that the voltage at the base of transistor Q2 controls the duty cycle of transistor Q1. With a higher voltage at the base of transistor Q2, the base-emitter voltage is greater, the current flow is greater, the drop in voltage at the base of transistor Q1 occurs more quickly, and transistor Q1 is turned on faster for a larger duty cycle. Of course, the converse is also true. Regardless, the voltage at the base of transistor Q2 and hence the duty cycle of transistor Q1 is essentially controlled by the values of voltage divider resistors R4 and R5. Resistor R3 is preferably not a factor in controlling the duty cycle as R3 acts as a voltage offset equally to both the base and emitter of transistor Q2; the base via the R3-R4-R5 voltage divider; and the emitter via the emitter and hence collector of transistor Q1 and R7. It should be appreciated that the duty cycle of transistor Q1 is substantially independent of the voltage of the positive supply line as such a change will also affect the voltages at the base and emitter of transistor Q2 substantially equally.

The pulse generator invention not only provides a pulse generator whose duty cycle is substantially independent of supply voltage, but also is substantially independent of input pulse frequency. When the input frequency increases, the negative edge comes faster causing Q1 to turn off more quikly than it would have (i.e. a shorter duty cycle). However, the voltage at the emitter of Q2 (charge accumulating on capacitor C3) does not rise as much as it would have otherwise. Hence, at the next cycle, the base-emitter voltage of transistor Q2 is greater than it would have been otherwise, and charge from capacitor C2 drains through transistor Q2 at a greater rate. As a result, the voltage at the base of transistor Q1 drops faster and turns transistor Q1 on earlier. If the input frequency maintains its higher rate, the system eventually stabilizes with the increased incidences of the negative edge of the input pulse being compensated by the larger base-emitter voltage of transistor Q2, and hence the turning on of transistor Q1 after a shorter period. In this manner, the duty cycle of transistor Q1 is maintained. Conversely, where the frequency of the input pulse decreases, a similar but opposite situation arises such that transistor Q1 is initially on longer than otherwise. However, with a rising voltage at the emitter of transistor Q2, the current flow through transistor Q2 is reduced, and the voltage drop at the base of transistor Q1 is slowed. This slowing of the voltage drop at the base acts to turn transistor Q1 on after a longer period such that the duty cycle of transistor Q1 is maintained at its desired value.

Figure 4:
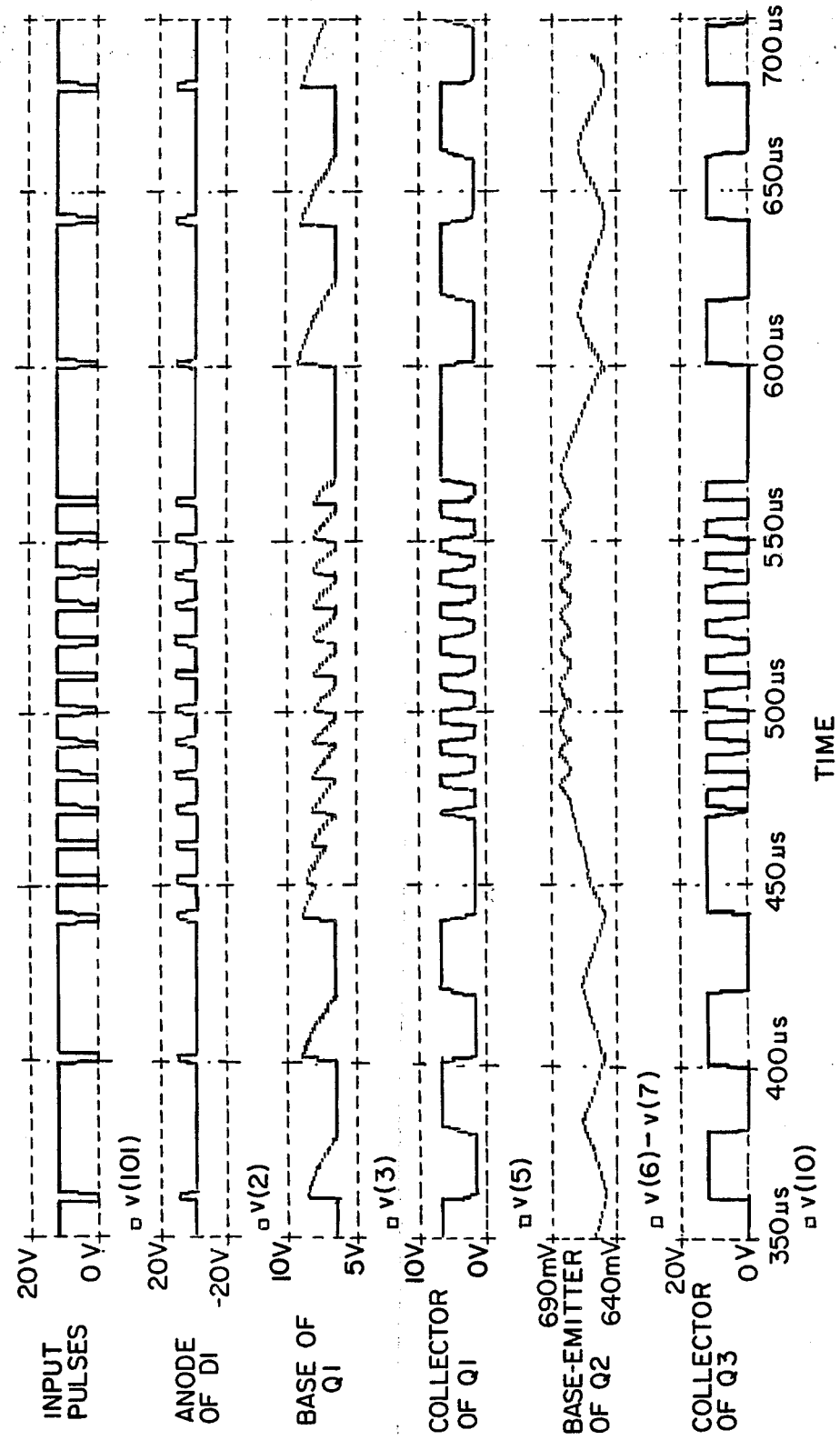
FIG. 4 is a graph of input, output, and error voltage waveforms of the circuit diagram of FIG. 1 during changes in input frequency from below the 2H frequency, which is the frequency used for sequential scans, to above the 2H frequency.

The ability of the preferred arrangement of FIG. 1 to maintain a constant duty cycle even when the input frequency changes is best seen with reference to FIG. 4. The six plots of FIG. 4 detail the voltages over time at the circuit input, the anode of diode D1, the base of transistor Q1, the collector of transistor Q1, the base-emitter difference of transistor Q2, and the collector of transistor Q3 (circuit output). As indicated, at 350 microseconds, the duty cycle control circuit is generating pulses of 46% duty cycle which are triggered by input pulses at 25 KHz (which is below the 2 H frequency; the frequency used for sequential scans). At 450 microseconds, the input frequency is seen to change to 100 KHz (which is above the 2 H frequency). At that time, transistor Q1 is off (the Q1 collector voltage is low), and the output voltage is high (the Q3 collector voltage is high). From 440 microseconds until approximately 468 microseconds, the circuit output stays in a high state because capacitor C2 (the voltage of which is seen as the base voltage of transitor Q1) does not discharge to a low enough voltage to turn transistor Q1 on. While transistor Q1 is off, capacitor C3 discharges, thereby decreasing the voltage at the emitter of transistor Q2 and hence increasing the base-emitter voltage of Q2 as indicated in the fifth plot. At 468 microseconds, transistor Q2 is seen to draw enough charge from capacitor C2 so as to drop the voltage at the base of transistor Q1 low enough to turn transistor Q1 on. However, two microseconds later, Q1 is turned back off by another input pulse. From 470 microseconds to about 500 microseconds, the duty cycle of transistor Q1 stabilizes as the voltage of the emitter of transistor Q2 drops a little more (over three cycles). The slightly increased base-emitter Q2 voltage slightly increases the duty cycle of transistor Q1 to its previous 46% even though the cycle frequency has changed significantly.

At five hundred and sixty microseconds in FIG. 4, the input frequency is seen to revert to its original 25 KHz. As a result, transistor Q1 remains on (collector voltage of Q1 high; output voltage low) until the next input pulse is received at six hundred microseconds. While transistor Q1 is on (particularly from five hundred sixty to six hundred microseconds), capacitor C3 charges up by drawing current from capacitor C2 through transistor Q2, thereby reducing the base-emitter voltage of transistor Q2. After the pulse at six hundred microseconds, transistor Q1 is turned off and stays off for a longer period of time than during the 100 KHz cycles, as transistor Q2 draws less current from capacitor C2 because the Q2 base-emitter voltage is smaller While transistor Q1 is turned off for a longer period of time, it still is not off for forty-six percent of the 25 KHz cycle. However, during the time period from six hundred to seven hundred microseconds, the circuit stabilizes such that the forty-six percent duty cycle is restored.

Returning to FIG. 1, diode D2 is added to the provided duty cycle control loop to make the pulse generator substantially independent of temperature effects. With the provision of diode D2 and its location, a change in temperature will cause the voltage at the base of transistor Q2 to change with the same temperature coefficient as the base-emitter voltage of transistor Q2. As a result, the emitter voltage of Q2, and therefore the duty cycle of transistor Q1 remain substantially constant even when the temperature changes.

Because a controlled duty cycle output signal is often used as an input to another circuit, an output circuit which acts as a buffer for the duty cycle signal at the collector of transistor Q1 is provided in FIG. 1. The preferred output circuit is comprised of a pull-down transistor Q3, a voltage divider with resistors R8 and R9, a speed-up capacitor C5, and a pull-up resistor R10. With the provided arrangement, the voltage at the output of the collector of transistor Q1 which is of controlled duty cycle is divided down by resistors R8 and R9. When transistor Q1 is on, the voltage at its collector is high, and even though the voltage at the base of transistor Q3 is reduced considerably below the Q1 collector voltage, the voltage is still great enough to turn on transistor Q3. With transistor Q3 on, the voltage at the output of the pulse generator (i.e. at the collector of transistor Q3) goes low. When transistor Q1 turns off and the voltage at its collector goes low (to about 2 V), speed-up capacitor C5 forces the voltage at the base of transistor Q3 to immediately drop and turn off transistor Q3 completely. With transistor Q3 off, the voltage at the output quickly moves high as resistor R10 acts to prevent the collector of transistor Q3 from floating. It should be noted that resistors R8 and R9 are chosen so as to divide the voltage at the collector output of transistor Q1 such that when Q1 is on, the voltage at the junction of resistors R8 and R9 is high enough to turn on transistor Q3 (i.e. greater than 0.7 V), while when transistor Q1 is off, the voltage at the junction of resistors R8 and R9 is low enough to keep transistor Q3 completely off.

Figure 2:
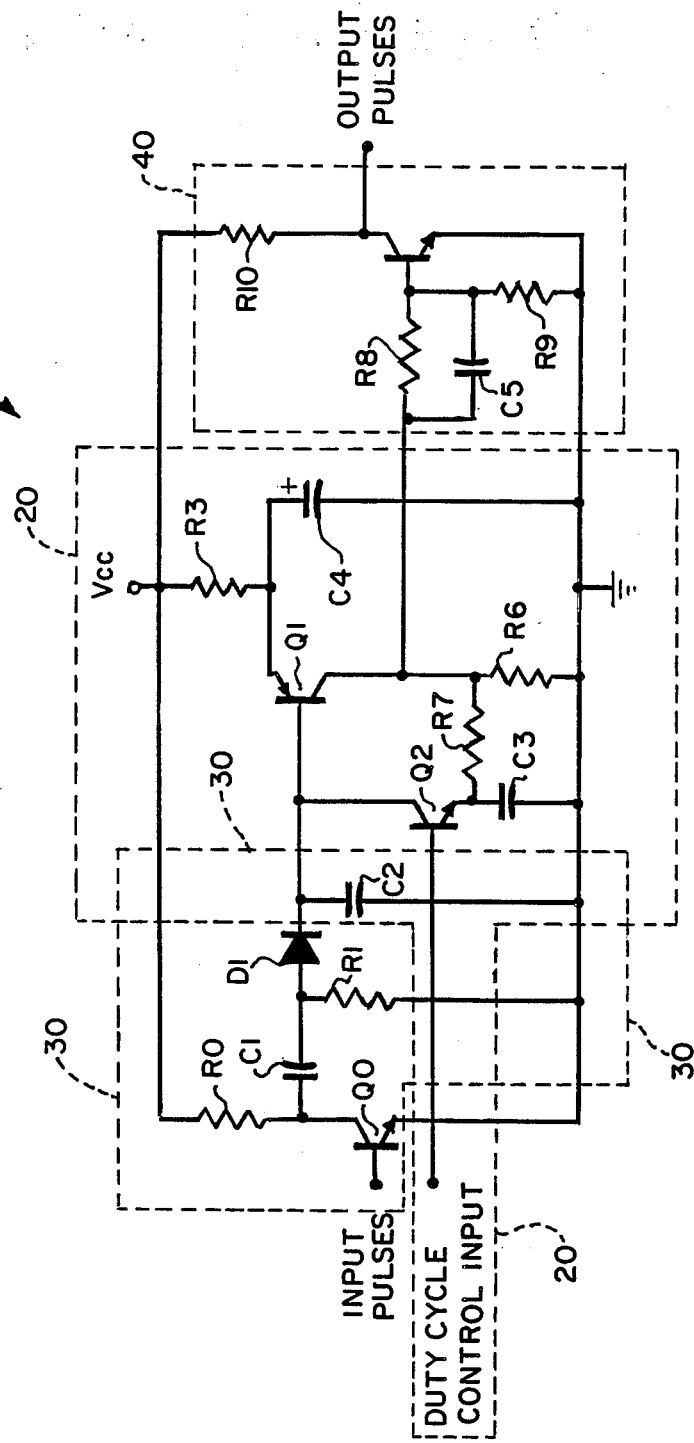
FIG. 2 is a circuit diagram of the pulse generator of controllable duty cycle where the duty cycle is controllable by a control input.

If it is desired to be able to change the duty cycle of a provided circuit without changing the duty cycle control means elements (i.e. resistors R4 and R5), a voltage control must be provided to the base of transistor Q2. Such an arrangement is shown in FIG. 2 which is equivalent to FIG. 1. Instead of resistors R4 and R5, a duty cycle control input is provided as an input to the base of transistor Q2. By controlling the voltage of the duty cycle control input, the duty cycle of transistor Q1 is controlled just as in the circuit of FIG. 1.

Figure 3:
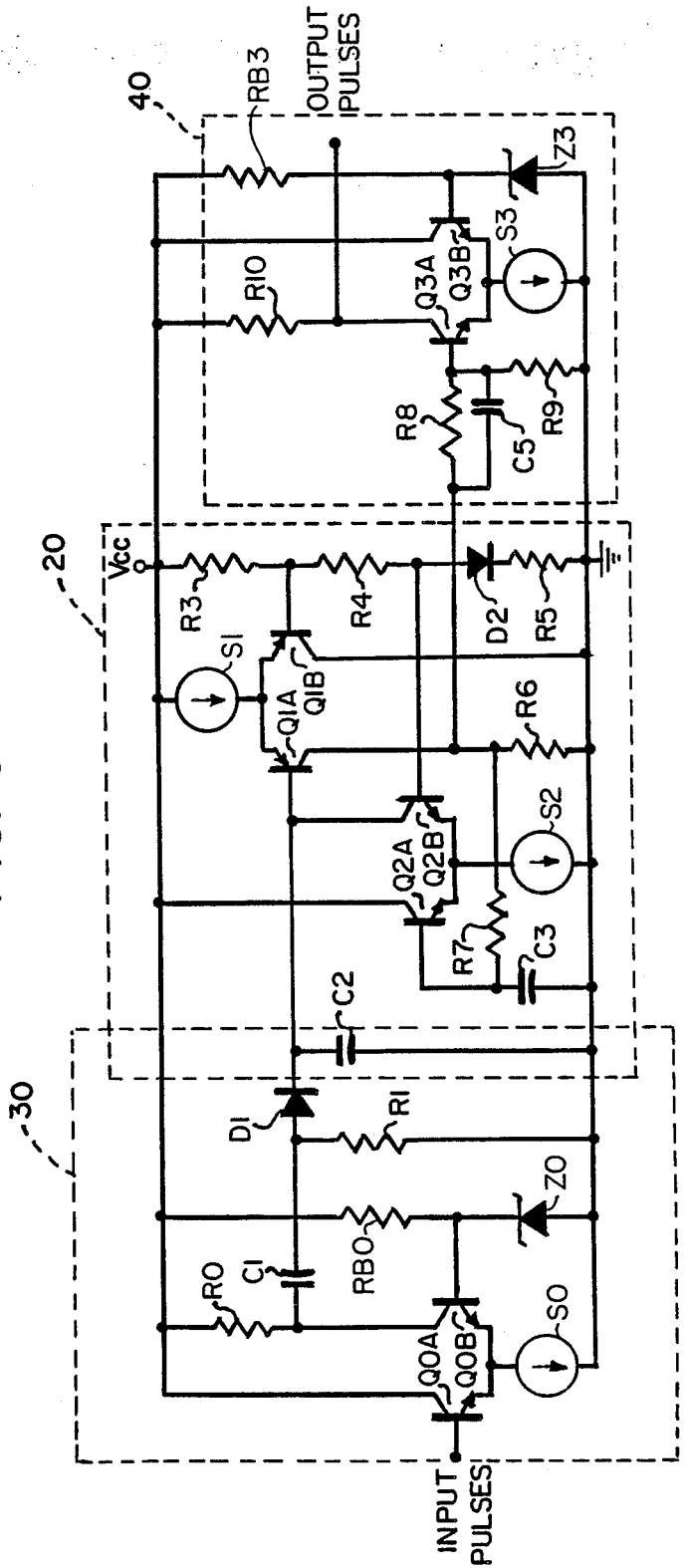
FIG. 3 is a circuit diagram of a second embodiment of the pulse generator of controllable duty cycle having a control loop which is functionally equivalent to the circuit of FIG. 1.

Turning to FIG. 3, a pulse generator of controllable duty cycle which is substantially equivalent to the pulse generator of FIG. 1 is seen. Each transistor of FIG. 1 is replaced with a differential amplifier, and as shown in FIG. 3, with each differential amplifier comprising two transistors with common emitters (a differential pair) connected to a current source. Transistor Q1A operates in a functionally equivalent manner to transistor Q1 of FIG. 1. Transistor Q1B and its associated current source S1 operate as functional equivalents to resistor R3 and capacitor C4 of FIG. 1; current in transistor Q1A is provided by the current source S1 in FIG. 3 and is provided by resistor R3 and capacitor C4 in FIG. 1. When transistor Q1A is off, transistor Q1B is on, and the current of the associated current source S1 is sent to ground through transistor Q1B. As a result, the power supply current does not change when transistor Q1A switches, and less electromagnetic radiation is produced.

The differential pair Q2A and Q2B operate as functional equivalents to transistor Q2 of FIG. 1. In particular, differential pair Q2A and Q2B provide the error feedback function of transistor Q2 of FIG. 1, as the voltage at the base of transistor Q2A is a function of the duty cycle of transistor Q1A (as detected by duty cycle detection means R7 and C3), while the voltage at the base of transistor Q2B is a function the duty cycle control means (voltage divider resistors R4 and R5). Thus, if transistor Q1A were to be on for too long a period of time, the voltage over capacitor C3 would increase, and the voltage at the base of transistor Q2A would rise relative to the voltage at the base of transistor Q2B. As a result, during the next cycle, less current would flow through transistor Q2B, and capacitor C2 would discharge more slowly thereby forcing transistor Q1A to stay off for a longer period of time and reducing the duty cycle of the circuit. The advantage of using the differential pair Q2A and Q2B is that current that discharges from capacitor C2 flows through the current source associated with that differential pair and not through resistors R7 and R6 as required in FIG. 1. Hence, the offset in the duty cycle detector is reduced, and capacitor C2 may be discharged faster with larger currents.

With respect to differential pairs Q0A and Q0B, and Q3A and Q3B, the resistors RB0 and RB3 and zener diodes Z0 and Z3 coupled to the bases of Q0B and Q3B provide a DC voltage to bias each differential pair. When the voltage on the base of Q0A is below the voltage on the zener diode Z0 at the base of Q0B, then Q0A is off and Q0B is on. Conversely, when the voltage on the base of Q0A is above the voltage on the base of Q0B, then Q0A is on and Q0B is off. Transistor pair Q3A and Q3B operates in the same manner.

Differential pair Q0A and Q0B and their associated current source S0, zener diode Z0 and resistor RB0, together with resistors R0 and R1, capacitors C1 and C2, and diode D1 as arranged in FIG. 3 provide a positive edge trigger means for transistor Q1A. When the input pulse is low, transistor Q0A is off (Q0B is on), and the voltage at the base of transistor Q1A is low, permitting transistor Q1A to stay on. When the input pulse goes high, transistor Q0A turns on (Q0B goes off), capacitor C2 charges, and the voltage at the base of transistor Q1A goes high, turning transistor Q1A off. Of course, if a negative edge trigger were desired, the same could be obtained by connecting resistor R0 and capacitor C1 to transistor Q0A instead of Q0B.

There has been described and illustrated herein pulse generators having output duty cycles which can set to desired values and which are substantially free from changes in the input pulse frequency as well as changes in supply voltage and temperature. The pulse generator, while being advantageous for horizontal synchronization signals in a television receiver, may be used wherever a contant duty cycle signal is required. Thus, while particular embodiments of the invention have been described, it is not intended that the invention be limited thereby, as it is intended that the invention be broad in scope. For example, while particular circuits for the edge trigger means were provided, different circuits (positive or negative triggers) could be utilized provided they accomplish the functions of changing the state of the duty cycle transistor and controlling the charge on the capacitor which controls the voltage at the base of the duty cycle transistor. Similarly, while a particular output buffer circuit was disclosed, different output buffer circuits can be utilized to buffer the duty cycle transistor output from the loading circuit. While such buffer circuits would preferably not change the duty cycle output signal of the duty cycle transistor (except for inversion, if desired), it is considered to be within the scope of the invention to further change the duty cycle output, if desired. On the other hand, it should be noted that depending on the load on the output, an output buffer circuit might not be required at all.

It will further be recognized that while particular circuitry has been provided for the various elements of the duty cycle control loop (e.g. the duty cycle detector means, duty cycle control means, duty cycle comparator means, and error feedback means), different equivalent circuitry could be provided For example, the single transistors used as the comparator and the error (feedback) amplifier (FIG. 1) could be replaced by differential amplifiers (FIG. 3), or other transistor devices such as, without limitation, operational amplifiers. Indeed, it should be noted that the terms "comparator means", and "error feedback means" are used in their very broadest sense. Thus, "comparator" transistor Q1 (or Q1A and Q1B) compares the voltage at its base to the voltage at its emitter, while the "error feedback" transistor Q2 (Q2A and Q2B) feeds its base-emitter voltage "error" signal back to the base of the comparator transistor Q1. Further yet, it should be appreciated that the words "controllable duty cycle" are also used in their broadest sense and are intended to include those circuits which are preset to a controlled duty cycle (e.g. FIGS. 1 and 3) as well as those circuits (e.g. FIG. 2) where the duty cycle may be changed as desired. Therefore, it will be apparent to those skilled in the art that yet other changes and modifications may be made to the invention as described without departing from the scope of the invention as so claimed.

I claim:

1. A pulse generator of controllable duty cycle having a pulse input and providing a pulsed output of controllable duty cycle, comprising:
    (a) a duty cycle control loop comprising, a comparator means having an output coupled to said controllable duty cycle pulsed output, a duty cycle detector means coupled to said comparator means for detecting the duty cycle of the output of said comparator means, a duty cycle control means for setting said duty cycle of said output of said comparator means to a desired value, and an error feedback means coupled to said duty cycle control means, said duty cycle detector means, and said comparator means; and
    (b) an edge trigger means for triggering a change in state of said comparator means in response to an edge of said input pulse.

2. A pulse generator according to claim 1, further comprising:
    (c) an output buffer means coupled to said comparator means output and to said pulse genertor pulsed output for buffering the output of said comparator means from a load coupled to said pulse generator pulsed output.

3. A pulse generator according to claim 1, wherein: said comparator means comprises a first transistor, and said error feedback means comprises a second transistor.

4. A pulse generator according to claim 3, wherein:

said first transistor is a transistor of a first type and said second transistor is a transistor of a second type.

5. A pulse generator according to claim 4, wherein:
said transistor of a first type is a pnp transistor with an emitter coupled to a voltage source, and a base coupled to said edge trigger means, and
said transistor of a second type is an npn transistor with a collector coupled to said base of said pnp transistor, a base coupled to said duty cycle control means, and an emitter coupled to said duty cycle detector means.

6. A pulse generator according to claim 1, wherein:
said duty cycle control means comprises a voltage divider comprised of at least two resistors, wherein a node between two of said resistors of said voltage divider is coupled to said error feedback means.

7. A pulse generator according to claim 5, wherein:
said duty cycle control means comprises a voltage divider comprised of at least two resistors, wherein a node between two of said resistors of said voltage divider is coupled to said base of said npn transistor.

8. A pulse generator according to claim 1, wherein:
said duty cycle detector means comprises a resistor-capacitor pair connected in series between a first voltage supply rail and said comparator means output wherein said resistor of said resistor-capacitor pair is coupled across said comparator means output and said error feedback means.

9. A pulse generator according to claim 5, wherein:
said duty cycle detector means comprises a resistor-capacitor pair connected in series between a first voltage supply rail and said collector of said pnp transistor, wherein said resistor of said resistor-capacitor pair is coupled across said collector of said pnp transistor and said emitter of said npn transistor.

10. A pulse generator according to claim 7, wherein:
said duty cycle detector means comprises a resistor-capacitor pair connected in series between a first voltage supply rail and said collector of said pnp transistor, wherein said resistor of said resistor-capacitor pair is coupled across said collector of said pnp transistor and said emitter of said npn transistor.

11. A pulse generator according to claim 10, wherein:
said duty cycle control loop further comprises a second capacitor coupled between said first voltage supply rail and said base of said pnp transistor.

12. A pulse generator according to claim 11, wherein:
said duty cycle control loop further comprises another resistor coupled between said first voltage supply rail and said resistor of said resistor-capacitor pair.

13. A pulse generator according to claim 12, wherein:
said duty cycle control loop further comprises a third capacitor coupled between said voltage first supply rail and said emitter of said pnp transistor, and a further resistor coupled between a second voltage supply rail and said emitter of said pnp transistor.

14. A pulse generator according to claim 13, wherein:
said duty cycle control loop further comprises a diode coupled to said base of said npn transistor.

15. A pulse generator according to claim 1, wherein:
said edge trigger means is a negative edge trigger means and comprises a first transistor having a base coupled to said input pulses and an emitter coupled to a first voltage supply rail, a first resistor coupled between a collector of said first transistor and a second voltage supply rail, a diode coupled between said collector of said first pull-down transistor and said comparator means, and a capacitor coupled between said first voltage supply rail and said comparator means.

16. A pulse generator according to claim 15, wherein:
said negative edge trigger means further comprises a second capacitor coupled between said collector of said first transistor and said diode and a second resistor coupled between a junction of said second capacitor and said diode and said first voltage supply rail.

17. A pulse generator according to claim 11, wherein:
said edge trigger means is a negative edge trigger means and comprises a third transistor having a base coupled to said input pulses and an emitter coupled to said first voltage supply rail, a first resistor of said edge trigger means coupled between a collector of said third transistor and a second voltage supply rail, a diode coupled between said collector of said third transistor and said base of said pnp transistor, and said second capacitor of said duty cycle control loop.

18. A pulse generator according to claim 17, wherein:
said negative edge trigger means further comprises a second capacitor of said negative edge trigger means coupled between said collector of said third transistor and said diode, and a second resistor of said negative edge trigger means coupled between a junction of said second capacitor of said negative edge trigger means and said diode and said first voltage supply rail.

19. A pulse generator according to claim 11, further comprising:
(c) an output buffer means for buffering said collector of said pnp transistor from a load coupled to said output of said pulse generator, wherein said output buffer means comprises an output buffer voltage divider coupled between said collector of said pnp transistor and said first voltage supply rail, a pull-down transistor having an emitter coupled to said first voltage supply rail, a collector coupled to an output of said pulse generator and said load, and a base coupled to said output buffer voltage divider.

20. A pulse generator according to claim 19, wherein:
said output buffer means further comprises a pull-up resistor coupled between a second voltage supply rail and said collector of said pull-down transistor, and a third capacitor coupled in parallel with a resistor of said output buffer voltage divider.

21. A pulse generator according to claim 1, wherein:
said duty cycle control means comprises a control signal input means coupled to said error feedback means for providing a desired voltage to said error feedback means.

22. A pulse generator according to claim 21, wherein:
said desired voltage of said control signal input means is controllable and variable.

23. A pulse generator according to claim 22, wherein:
said duty cycle control means comprises a control signal input means coupled to said base of said npn transistor for providing a desired voltage to said base of said npn transistor.

24. A pulse generator according to claim 23, wherein:
said desired voltage of said control signal input means is controllable and variable.

25. A pulse generator according to claim 1, wherein:
said comparator means comprises a first differential transistor pair and a first associated current source coupled to common emitters of said first differential transistor pair, and said error feedback means comprises a second differential transistor pair and a second associated current source coupled to common emitters of said second differential transistor pair.

26. A pulse generator according to claim 25, wherein:
said first differential transistor pair is comprised of a first and a second pnp transistor, said first pnp transistor having a base coupled to said edge trigger means, and
said second differential transistor pair is comprised of a first and a second npn transistor, said first npn transistor having a collector coupled to said base of said first pnp transistor, and a base coupled to said duty cycle control means, and said second npn transistor having a base coupled to said duty cycle detector means.

27. A pulse generator according to claim 26, wherein:
said duty cycle control means comprises a voltage divider comprised of at least two resistors, wherein a node between two of said resistors of said voltage divider is coupled to said base of said first npn transistor.

28. A pulse generator according to claim 27, wherein:
said duty cycle detector means comprises a capacitor-resistor pair, the capacitor of which is coupled between a first voltage supply rail and a base of said second npn transistor of said second differential transistor pair, and the resistor of which is coupled to said base of said second npn transistor of said second differential transistor pair, and to said collector of said first pnp transistor of said first differential transister pair.

29. A pulse generator according to claim 28, wherein:
said duty cycle control loop further comprises a second capacitor coupled between said first voltage supply rail and said base of said first pnp transistor of said first differential transistor pair, and another resistor coupled between said first voltage supply rail and said resistor of said resistor-capacitor pair.

30. A pulse generator according to claim 25, wherein:
said edge trigger means comprises
a third differential transistor pair having a third associated current source and an associated resistor and zener diode coupled to a base of a first transistor of said third differential transistor pair, wherein a base of a second transistor of said third differential transistor pair is coupled to said input pulses,
a first resistor coupled between a collector of one of said first and second transistors of said third differential transistor pair and a first voltage supply rail,
a diode coupled between said collector of said one of said first and second transistors of said third differential transistor pair and said comparator means, and
a capacitor coupled between a second voltage supply rail and said comparator means.

31. A pulse generator according to claim 30, wherein:
said first resistor and diode are coupled to said first transistor of said third differential transistor pair and said edge trigger means is a positive edge trigger means.

32. A pulse generator according to claim 30, wherein:
said first resistor and said diode are coupled to said second transistor of said third differential transistor pair and said edge trigger means is a negative edge trigger means.

33. A pulse generator according to claim 1 wherein:
said pulse input into said pulse generator is a horizontal synchronization pulse of a television receiver.

34. A pulse generator according to claim 14 wherein:
said pulse input into said pulse generator is a horizontal synchronization pulse of a television receiver.

35. A pulse generator according to claim 23 wherein:
said pulse input into said pulse generator is a horizontal synchronization pulse of a television receiver.

36. A pulse generator according to claim 26 wherein:
said pulse input into said pulse generator is a horizontal synchronization pulse of a television receiver.

* * * * *